United States Patent [19]
Masujima et al.

[11] Patent Number: 4,873,397
[45] Date of Patent: Oct. 10, 1989

[54] ELECTRONIC CIRCUIT ELEMENT

[75] Inventors: Sho Masujima; Hiroshi Yagi; Atsuzo Tamashima; Jun Tamashima, all of Tokyo, Japan

[73] Assignee: TDK Corporation, Tokyo, Japan

[21] Appl. No.: 138,237

[22] Filed: Dec. 28, 1987

[30] Foreign Application Priority Data

Dec. 25, 1986 [JP] Japan .......................... 61-200044[U]
Mar. 25, 1987 [JP] Japan ............................ 62-43693[U]
Mar. 25, 1987 [JP] Japan ............................ 62-43694[U]

[51] Int. Cl.$^4$ ............................................. H05K 1/18
[52] U.S. Cl. ................................ 174/117 A; 174/68.5; 361/400
[58] Field of Search ............... 361/400, 403, 406, 405; 174/68.5, 117 A

[56] References Cited

U.S. PATENT DOCUMENTS

| | | | |
|---|---|---|---|
| 3,655,496 | 4/1972 | Ettre et al. | 174/68.5 |
| 3,704,515 | 12/1972 | Nelson | 174/68.5 X |
| 4,157,932 | 6/1979 | Hirata | 174/68.5 X |
| 4,326,239 | 4/1982 | Ohsawa et al. | 174/68.5 X |
| 4,339,785 | 7/1982 | Ohsawa | 361/400 X |
| 4,489,487 | 12/1984 | Bura | 361/400 |
| 4,554,575 | 11/1985 | Lucas | 174/68.5 X |
| 4,654,965 | 4/1987 | Uehara et al. | 361/400 X |
| 4,679,122 | 7/1987 | Belke et al. | 174/68.5 X |
| 4,731,503 | 3/1988 | Kitanishi | 174/117 A X |
| 4,744,850 | 5/1988 | Imano et al. | 174/117 A X |

FOREIGN PATENT DOCUMENTS

| | | | |
|---|---|---|---|
| 0016984 | 10/1980 | European Pat. Off. | 361/400 |
| 1199231 | 7/1970 | United Kingdom | 361/400 |

Primary Examiner—R. R. Kucia
Attorney, Agent, or Firm—Helfgott & Karas

[57] ABSTRACT

An electronic circuit element capable of positively and stably accomplishing its provisional fixing on a printed circuit board substantially free of any trouble and being readily taken out or extracted for the mounting on a printed circuit board, irrespective of a manner of holding of the circuit element prior to the extraction. The electronic circuit element includes an element body and an adhesive or polymeric layer deposited on the element body. The polymeric layer is arranged on a surface of the element body opposite to a printed circuit board on which the circuit element is to be mounted. The polymeric layer is formed of a material exhibiting adhesion when it is heated to a temperature of about 80° C.

10 Claims, 3 Drawing Sheets

ELECTRONIC CIRCUIT ELEMENT

BACKGROUND OF THE INVENTION

1. Field of the Invention

This invention relates to an electronic circuit element, and more particularly to an electronic circuit element which is adapted to be fixedly mounted on a printed circuit board by soldering while being stably provisionally fixed on the board by means of an adhesive.

2. Description of the Prior Art

Conventionally, mounting of a plurality of electronic circuit elements on a single printed circuit board is typically carried out in such a manner that a predetermined number of electronic circuit elements are provisionally held at predetermined positions on the printed circuit board and then practically secured to the printed circuit by soldering.

Such an electronic circuit element is generally classified into two types or a surface-mounted-type electronic circuit element which is adapted to be fixed on a conductive pattern formed on a printed circuit board and a lead-type electronic circuit element which is adapted to be vertically mounted with respect to a printed circuit board by securely inserting lead wires of the element via through-holes of the printed circuit board and soldering the lead wires to the board.

The surface-mounted-type electronic circuit element includes a chip-type electronic circuit element such as a chip capacitor or the like and a special-type electronic circuit element such as an IC or the like. Provisional or temporary fixing of the surface-mounted-type electronic circuit element on a printed circuit board which is carried out prior to soldering operation is generally performed by previously applying an adhesive to a circuit element mounting portion of the printed circuit board by screen printing or the like and then placing the circuit element on the printed circuit board by means of a suction head of an automatic mounting apparatus to provisionally fix the element on the printed circuit board through the adhesive. Previous application of the adhesive to the printed circuit board renders direct stacking of the printed circuit boards impossible, resulting in handling of the printed circuit boards being highly troublesome. In view of such a problem, it is proposed that the provisional fixing is carried out by previously preparing an electronic circuit element series which comprises a carrier tape and a plurality of electronic circuit elements held on the carrier tape through a thermosetting adhesive applied onto a flat surface of the carrier type, then extracting the circuit elements one by one from the carrier tape means of a suction head of an automatic mounting apparatus and placing the circuit elements on a printed circuit board by the suction head to provisionally fix them on the printed circuit board through the thermosetting adhesives which may adhere to the sides of the electronic circuit elements when the electronic circuit elements are removed from the tape. An example of an electronic circuit element series of this kind is found, for example, in Japanese Utility Model Registration No. 1405587 (Japanese Utility Model Publication No. 11438/1981) to TDK Corporation.

Unfortunately, the proposed techniques fail to facilitate operation of releasing or extracting the electronic circuit elements from the carrier tape by the section head because the adhesive firmly holds the circuit elements on the carrier tape to a degree sufficient to prevent the smooth peeling-off. Even when the electronic circuit element is released from the tape, it pulls the carrier tape through the adhesive during the peeling-off operation. This results in the carrier tape acting on electronic circuit elements adjacent to the released one when it elastically returns to the original position, to thereby cause them to be separated from the carrier tape. Another disadvantage of the prior art is that the adhesive remains on the carrier tape to fail in sticking to the circuit element when the element is peeled off from the carrier tape.

Mounting of a lead-type electronic circuit element on a printed circuit board is generally carried out by clinching operation wherein lead wires of the circuit element inserted via through-holes of the printed circuit board are each perpendicularly bent at a tip end thereof projected outwardly from the board, so that the circuit element may be provisionally fixed on the printed circuit board by cooperation between the bent lead wires and a kink formed along an axis of each of the lead wires by bending. Then, the previously fixed lead-type electronic circuit element is practically secured to the printed circuit board by soldering the bent ends of the lead wires onto a rear surface of the printed circuit board.

Unfortunately, the above-described fixing procedure causes the lead-type electronic circuit element to fall down during the provisional fixing operation or transportation to a soldering station. This not only leads to a failure in the mounting but causes the perpendicularly bent tip end portions of the lead wires of the falling-down circuit element to hinder mounting of circuit elements adjacent thereto. Thus, the procedure fails in high density mounting of chip-type circuit elements on a printed circuit board.

SUMMARY OF THE INVENTION

The present invention has been made in view of the foregoing disadvantages of the prior art.

Accordingly, it is an object of the present invention to provide an electronic circuit element which is capable of positively and stably accomplishing its provisional fixing on a printed circuit board substantially free of any trouble.

It is another object of the present invention to provide an electronic circuit element which has an adhesive capable of exhibiting adhesion sufficient to positively carry out provisional fixing one of the electronic circuit element on a printed circuit board therethrough.

It is a further object of the present invention to provide a surface-mounted-type electronic circuit element which has an adhesive capable of exhibiting adhesion sufficient to positively attain provisional fixing of the electronic circuit element on a printed circuit board therethrough.

It is still another object of the present invention to provide a surface mounted-type electronic circuit element which is capable of being readily taken out or extracted for the mounting on a printed circuit board, irrespective of a manner of holding of the circuit element prior to the extraction.

It is yet another object of the present invention to provide a surface-mounted-type electronic circuit element which is capable of facilitating operation of provisionally fixing the circuit element on a printed circuit board.

It is still a further object of the present invention to provide a lead-type electronic circuit element which is capable of accomplishing its provisional fixing on a printed circuit board substantially free of any trouble and without any clinching treatment of lead wires.

It is yet a further object of the present invention to provide a lead-type electronic circuit element which is capable of significantly decreasing an area and/or a space required to solder lead wires of the electronic circuit element to a printed circuit board to accomplish high-density mounting.

It is an even further object of the present invention to provide a lead-type electronic circuit element which is capable of facilitating operation of provisionally fixing the circuit element on a printed circuit board.

In accordance with the present invention, an electronic circuit element is provided. The element includes an element body. The element body is provided with adhesive means on a surface thereof opposite to a printed circuit board on which the electronic circuit element is to be mounted. The adhesive means is formed of a material which exhibits adhesion upon being heated.

The adhesive means may be formed of a polymeric material selected from the group consisting of silicone and acrylic and exhibiting adhesion when it is heated to about 80° C.

The electronic circuit element of the present invention may be embodied in the form of both a surface-mounted-type electronic circuit element which includes at least one external terminal arranged on the element body and a lead-type one which includes a pad member of a predetermined thickness mounted on the surface of the element body opposite to the printed circuit board.

In the surface-mounted-type electronic circuit element, the adhesive means may take the form of a layer. The external terminal may have a solder layer arranged thereon.

In the lead-type electronic circuit element, the pad member may be formed of a polymeric foam material, which is expanded to the predetermined thickness by heating.

BRIEF DESCRIPTION OF THE DRAWINGS

These and other objects and many of attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, an electronic circuit element according to the present invention will be described hereinafter with reference to the accompanying drawings.

First, the present invention will be described with reference to a surface-mounted-type electronic circuit element which is one embodiment of the present invention and illustrated in FIGS. 1 to 3.

Figure 1:
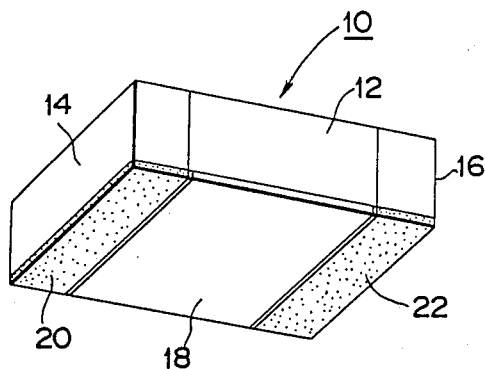
FIG. 1 is a perspective view illustrating a surface-mounted-type electronic circuit element which is one embodiment of an electronic circuit element according to the present invention.
Figure 2:
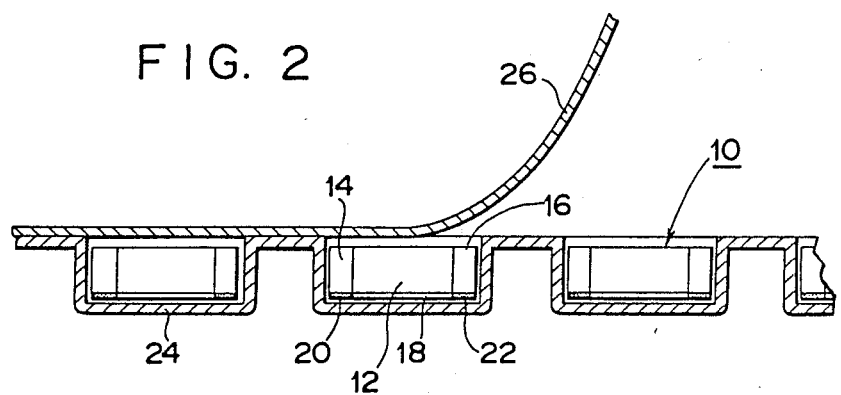
FIG. 2 is a side elevation view in section showing an embossed tape, in recesses of which the circuit elements shown in FIG. 1 are received.
Figure 3:
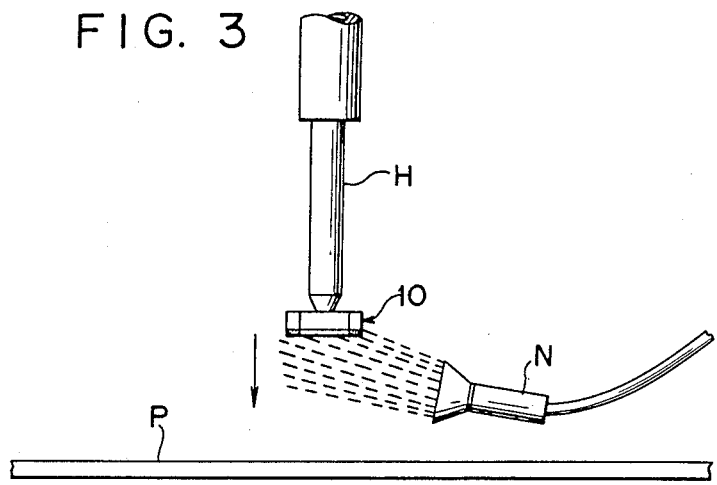
FIG. 3 is a schematic view showing a manner of mounting of the circuit element of FIG. 1.

A surface-mounted-type electronic circuit element shown in FIGS. 1 to 3 takes the form of a chip-capacitor and is generally designated by reference numeral 10. The chip capacitor 10, as shown in FIG. 1, generally includes an element body 12 formed into a substantially rectangular shape and at least one external terminal. In the illustrated embodiment, it includes two external terminals 14 and 16 integrally mounted on both sides of the element body 12. The element body 12 is provided with adhesive means 18 on a surface thereof opposite to a printed circuit board on which the chip capacitor is to be mounted. In the illustrated embodiment, the adhesive means 18 is in a form of a layer which is formed of a polymeric material, deposited on the surface of the element body 12. However, the adhesive means 18 is not limited to the form of a layer. Also, in the illustrated embodiment, the element body 12 is adapted to be placed on a printed circuit board with its bottom surface facing to the printed circuit board, and the polymeric layer 18 is deposited on a portion of the bottom surface of the element body 18 except the external terminals 14 and 16. The adhesive means or polymeric layer 18 may be formed of a polymeric material which exhibits adhesion upon being heated. For example, it may be formed of polymeric material selected from the group consisting of silicone and acrylic and exhibiting adhesion when it is heated to a temperature as low as about 80° C. The adhesive means 18 is in a form of a layer having a smooth or lubricous surface at a normal temperature. The external terminals 14 and 16 have solder layers 20 and 22 previously deposited thereon, respectively, which are formed of a solder material which effects soldering at a temperature as low as about 100° C. and remelted at a temperature of about 130° C.

The chip capacitor 10 constructed as described above, as shown in FIG. 2, is received in each of recesses of an embossed tape 24 in a manner such that the bottom surface of the chip capacitor on which the polymeric layer 18 is deposited faces downwardly. After a predetermined number of the chip capacitors 10 are received in the recesses of the embossed tape 24, the embossed tape is covered with a top tape 26 for safe storage and transportation of the chip capacitors. Thus, a series of the chip capacitors which are successively fed to a suction head of an automatic mounting apparatus described hereinafter is formed.

When a chip capacitor 10 received in each of the recesses of the tape 24 is to be mounted on a printed circuit board, the cover tape 26 is peeled off from the embossed tape 24 to expose the chip capacitor 10. Subsequently, a suction head H is actuated to hold by suction and extract the chip capacitor 10 from the tape 24. Then, a polymeric layer 18 adhering to an element body 12 of the chip capacitor 10 having been held by the suction head H is subjected to a heating treatment using hot air ejected from an injection nozzle N as shown in FIG. 3 suction before the head H is lowered to cause the chip capacitor 10 to be placed on a printed circuit board P. The heating treatment may be carried out using, as the hot air, air heated to a temperature of about 80° C., resulting in the polymeric layer 18 exhibiting adhesion. Then, the suction head H having the capacitor 10 held thereon by suction is moved downwardly to cause the element body 12 to be placed on the printed circuit board P, resulting in the chip capacitor 10 being provisionally fixed on the printed circuit board P by the heated adhesive means 18. At this time, the solder-deposited surfaces of the external terminals 14 and 16 are brought into contact contacted with a conductive pattern (not shown) previously formed on the printed circuit board P. The above-described procedure is substantially repeated to provisionally fix a predetermined number of circuit elements on the printed circuit board P to form a desired electronic circuit. Thereafter, the printed circuit board P having the electronic circuit elements provisionally fixed thereon is passed through a heating oven, having been maintained at a temperature of about 100° C., to melt the solder layers 20 and 22 of the electronic circuit element, resulting in the circuit elements being practically fixed on the printed circuit board P by the melted solders 20 and 22.

The above description has been made in connnection with surface mounting of the chip capacitor. However, it is a matter of course that it is applicable to an electronic circuit element having lead wires as external terminals such as IC or the like. Also, the chip capacitor of the illustrated embodiment is so constructed that it may be securely mounted on the printed circuit board by firmly fixing the external terminals on the printed circuit board by means of the solder layers 20 and 22 deposited thereon. Alternatively, the fixing may be carried out by means of a hot-melt type solder, a cream solder or the like which is previously applied onto a surface of the printed circuit board P by printing.

As can be seen from the foregoing, the surface-mounted-type electronic circuit element which is one embodiment of the present invention can be readily fixed on a printed circuit board at a relatively low temperature and for a short period of time, so that it may allow the mounting to be accomplished at a low cost even when it lacks heat resistance.

Also, in the surface-mounted-type electronic circuit element of the illustrated embodiment, the adhesive means which does not exhibit any adhesion at a normal temperature and exhibits adhesion only when it is heated is provided for use in temporary fixing of the electronic circuit element on a printed circuit board. Such construction not only permits a suction head of an automatic mounting apparatus to readily extract the electronic circuit element from an embossed tape without any trouble because the adhesive means does not exhibit any adhesion at a normal temperature but allows the element body to be positively provisionally fixed on a printed circuit board by the adhesive means 18 which has exhibited adhesion by heating.

Now, a lead-type electronic circuit element which is another embodiment of an electronic circuit element according to the present invention will be described hereinafter with reference to FIGS. 4 to 11.

Figure 4:
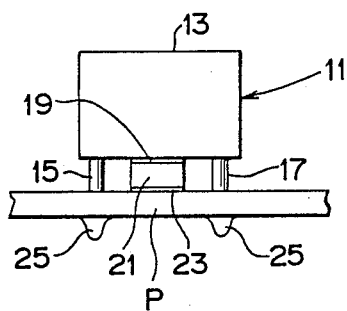
FIG. 4 is a front elevation view illustrating a lead-type electronic circuit element which is another embodiment of an electronic circuit element according to the present invention, the electronic circuit element being provided with a pad member of a predetermined thickness and fixedly mounted on a printed circuit board.

A lead-type electronic circuit element of the illustrated embodiment which is generally designated by reference numeral 11 in the drawings, as shown in FIG. 4, generally includes an element body 13 and lead wires 15 and 17 projecting downwardly from a bottom surface of the element body 13. The element body 13 is provided with a pad member 21 having a predetermined thickness. The pad member 21 is stuck through an adhesive 19 on a surface of the element body 13 which is opposed to a printed circuit board P when the lead wires 15 and 17 are inserted via through-holes (not shown), which is previously formed in the printed circuit board P to vertically mount the circuit element 11 on the printed circuit board P. In the illustrated embodiment, the pad member mounting surface of the element body 13 is its bottom surface. Also, the pad member 21 has adhesive means 23 previously applied to a surface thereof which is opposed to the printed circuit board P when the lead wires 15 and 17 are inserted through the through-holes of the board P. The adhesive means 23 may take the form of layer which is formed of a polymeric material. However, it is not limited to such a layer form. The pad member 21 may be formed into a size longitudinally and laterally smaller than the element body 13. Alternatively, it may be formed into substantially the same size as the element body 13. Also, the pad member 21 is formed so as to have a predetermined thickness or a thickness which permits the adhesive means 23 to be pressedly brought into contact with a surface of the printed circuit board P when the lead wires 15 and 17 are inserted through the through-holes of the printed circuit board P to vertically mount the electronic circuit element 11 on the printed circuit board by a desired height.

The adhesives 19 and 23 or at least the adhesive 23 which is applied to the surface of the pad member 21 opposite to the printed circuit board is preferably formed of a polymeric material, which is capable of exhibiting adhesion when it is heated to a temperature of about 80° C., such as, for example, silicone, acrylic or the like. The so-formed adhesive 23 effectively prevents dust and/or dirt from adhering thereto before mounting of the electronic circuit element onto the printed circuit board or during storage of the circuit element.

In the lead-type electronic circuit element 11 constructed as described above, when the adhesive 23 is softened by heating and then the lead wires 15 and 17 are inserted through the through-holes of the printed circuit board P, the element body 13 is stably provisionally fixed through the pad member 21 on the printed circuit board P by means of the softened adhesive 23. Thus, the lead-type electronic circuit element of the illustrated embodiment eliminates a necessity of downwardly projecting tip ends of the lead wires 15 and 17 from the printed circuit board P for clinching operation as in the prior art. Each of the lead wires 15 and 17 is preferably projected at the tip end from the printed circuit board P by a length sufficient to enusre smooth soldering operation described hereinafter. When it is desired to increase a length of the lead wires 15 and 17 as required in the case that the lead wires 15 and 17 are held on a carrier tape, for example, for storage of the lead-type electronic circuit element, the excess of each of the lead wires may be removed by cutting after the lead wires are inserted through the printed circuit board P.

Now, the manner of mounting of the lead-type electronic circuit element on the printed circuit board will be described hereinafter.

First, the adhesive 23 of the pad member 21 is exposed to hot air using a suitable means such as the injection nozzle N shown in FIG. 3 before the lead wires 15 and 17 are inserted via the through-holes of the printed circuit board P. This results in the adhesive 23 kept at a solid state being heated and softened to exhibit adhesion. Then, when the lead wires 15 and 17 are inserted through the printed circuit board P, the surface of the pad member 21, onto which the adhesive 23 is applied, is brought into contact with the printed circuit board P, resulting in the element body 13 being effectively provisionally fixed on the printed circuit board P by the adhesive 23 having exhibited adhesion. Thereafter, the tip ends of the lead wires 15 and 17 of the so-provisionally fixed electronic circuit element 11 which are projected from the printed circuit board P are subjected to soldering to securely mount the electronic circuit element 11 on the printed circuit board P by means of solders 25.

Figure 5:
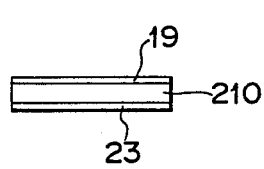
FIG. 5 is a schematic view showing a pad member formed of a polymeric foam material.
Figure 6:
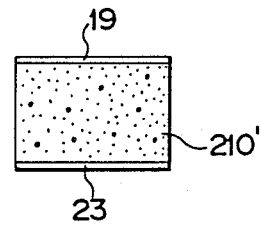
FIG. 6 is a schematic view showing the pad member of FIG. 5, which is expanded to a predetermined thickness by heating.
Figure 7:
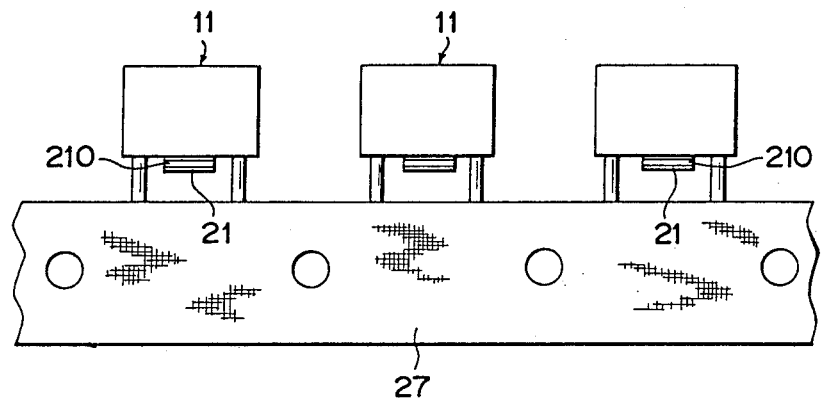
FIG. 7 is a schematic view showing lead-type electronic circuit elements each having the pad member of FIG. 5 mounted thereon which are held in a row on a tape.

The pad member 21 may comprise a pad member as indicated at reference numeral 210 in FIG. 5 which is formed of a polymeric foam material and constructed so as to have a thickness of about one tenth as large as the above-described predetermined thickness while it is not foamed. The pad member 210 is adopted to be expanded of the predetermined thickness when it is foamed by heating, as shown in FIG. 6. When a plurality of the lead-type electronic circuit elements 11 each having the so-formed pad member 210 mounted thereon are held on a carrier tape 27 in a row as shown in FIG. 7, storage and transportation of the circuit elements are conveniently attained.

Figure 8:
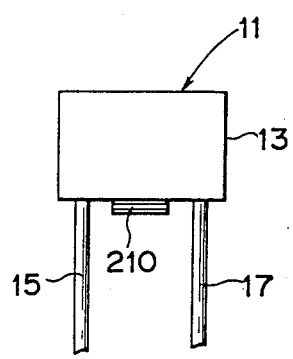
FIGS. 8 to 11 are schematic views showing a manner of mounting of the lead-type electronic circuit element of FIG. 7 on a printed circuit board.
Figure 9:
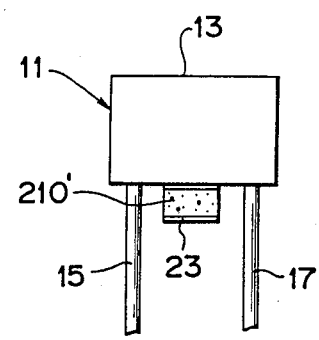
Figure 10:
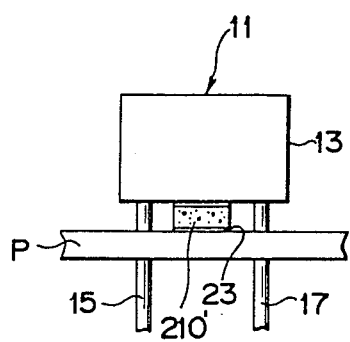
Figure 11:
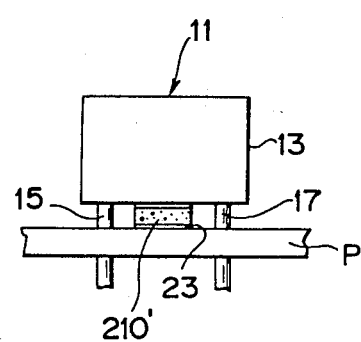

When the lead-type electronic circuit element 11 provided with the pad member 210 and held on the carrier tape 27 is mounted on a printed circuit board, the electronic circuit element 11 is removed from the carrier tape 27 as shown in FIG. 8 by releasing the lead wires 15 and 17 of the electronic circuit element 11 from the carrier tape 27. Then, the non-foamed pad member 210 of the circuit element 11 is heated, resulting in the pad member being expanded to predetermined thickness as indicated at reference numeral 210' in FIG. 9. Concurrently, the adhesive 23 which has been kept at a solid state is softened due to the heating to exhibit adhesion. Thus, insertion of the lead wires 15 and 17 via the through-holes of the printed circuit board P is carried out substantially free of any shock due to the pad member 210' expanded by foaming. Concurrently, the element body 13 of the lead-type electronic circuit element 11 is bonded to the printed circuit board P by the adhesive 23 having exhibited adhesion, resulting in the electronic circuit element being stably provisionally fixed on the board P as shown in FIG. 10. Accordingly, excessive portions of the tip ends of the lead wires 15 and 17 projected from the printed circuit board P are removed by cutting while portions thereof required for soldering remain as shown in FIG. 11, so that soldering of the lead wires to the printed circuit board may be accomplished without clinching operation.

As can be seen from the foregoing, the lead-type electronic circuit element of the illustrated embodiment permits the mounting operation to be readily carried out with high accuracy without clinching the lead wires. Also, it significantly decreases a space required for soldering of the lead wires to a degree sufficient to substantially enlarge a mounting area on the printed circuit board.

While preferred embodiments of the invention have been described with a certain degree of particularity with reference to the drawings, obvious modifications and variations are possible in the light of the above teachings. It is therefore to be understood that within the scope of the appended claims, the invention may be practiced otherwise than as specifically described.

What is claimed is:

1. A surface-mounted-type electronic circuit element adapted to be mounted on a printed circuit board, comprising:
    an element body having a surface opposed to the printed circuit board when mounted thereon;
    two external terminals mounted at two ends of said element body;
    adhesive means provided on said surface opposite to the printed circuit board, said adhesive means being formed of a material which exhibits adhesion only when it is heated; and
    a solder layer provided on a surface of each said external terminal, which is opposite to said printed circuit board, said solder layer being formed of a solder material which effects soldering at a temperature of about 100° C. and is remelted at a temperature of at least about 130° C.

2. An electronic current element as defined in claim 1, wherein said adhesive means is in a form of a layer.

3. An electronic circuit element as defined in claim 1, wherein said adhesive means is formed of a polymeric material selected from the group consisting of silicone and acrylic and exhibiting adhesion when it is heated to a temperature of about 80° C.

4. An electronic circuit element as defined in claim 1, wherein said adhesive means is in a form of a layer which is formed of a polymeric material selected from the group consisting of silicone and acrylic and exhibiting adhesion when it is heated to a temperature of about 80° C.

5. An electronic circuit element adapted to be mounted on a printed circuit board, comprising:
    an element body having lead wires projecting downwardly therefrom and adapted to be inserted into through-holes of the printed circuit board;
    a pad member having a predetermined thickness and stuck to a surface of said element body opposite to the printed circuit board, the predetermined thickness of said pad member substantially corresponding to a distance between said element body and said printed circuit board when said lead wires of said electronic circuit element are inserted into the through-holes of said printed circuit board; and
    adhesive means applied to a surface of said pad member opposite to said printed circuit board, and formed of a polymeric material selected from the group consisting of silicone and acrylic and exhibiting adhesion when it is heated to a temperature of about 80° C.

6. An electronic circuit element as defined in claim 19, wherein said pad member is formed of a polymeric foam material adapted to be expanded to said predetermined thickness upon being heated.

7. An electronic circuit element as defined in claim 19, wherein said adhesive means is in a form of a layer.

8. An electronic circuit element as defined in claim 19, wherein said adhesive means is in a form of a layer which is formed of a polymeric material selected from the group consisting of silicone and acrylic and exhibiting adhesion when it is heated to a temperature of about 80° C.

9. A surface-mounted-type electronic circuit element adapted to be mounted on a printed circuit board, comprising:
an element body having a surface opposed to the printed circuit board when mounted thereon;
two external terminals mounted at two ends of said element body;
adhesive means provided on said surface opposite to the printed circuit board, said adhesive means being in a form of a layer which is formed of a polymeric material selected from the group consisting of silicone and acrylic and exhibiting adhesion when it is heated to a temperature of about 80° C; and
a solder layer provided on a surface of each said external terminal which is opposite to said printed circuit board, said solder layer being formed of a solder material which effects soldering at a temperature of about 100° C. and is remelted at a temperature of at least about 130° C.

10. An electronic circuit element adapted to be mounted on a printed circuit board, comprising:
an element body having lead wires projecting downwardly therefrom and adapted to be inserted into through-holes of the printed circuit board;
a pad member formed of a polymeric foam material, which is adapted to be expanded to a predetermined thickness upon being heated, and stuck to a surface of said element body opposite to the printed circuit board, the predetermined thickness of said pad member substantially corresponding to a distance between said element body and said printed circuit board when said lead wires of said electronic circuit element are inserted into the through holes of said printed circuit board; and
adhesive means applied to a surface of said pad member opposite to said printed circuit board, said adhesive means being in a form of a layer which is formed of a polymeric material selected from the group consisting of silicone and acrylic and exhibiting adhesion when it is heated to a temperature of about 80° C.

* * * * *